United States Patent
Broekaert et al.

(10) Patent No.: US 6,798,282 B1
(45) Date of Patent: Sep. 28, 2004

(54) METHOD AND SYSTEM FOR TRANSIMPEDANCE AMPLIFIERS WITH HIGH CURRENT INPUT WHILE MAINTAINING HIGH TRANSIMPEDANCE GAIN AND BANDWIDTH

(75) Inventors: Tom Peter Edward Broekaert, Thousand Oaks, CA (US); Zbigniew Marian Nosal, Westlake Village, CA (US)

(73) Assignee: INPHI Corporation, Westlake Village, CA (US)

(*) Notice: Subject to any disclaimer, the term of this patent is extended or adjusted under 35 U.S.C. 154(b) by 0 days.

(21) Appl. No.: 10/335,300

(22) Filed: Dec. 31, 2002

(51) Int. Cl.[7] .............................................. H01L 31/00
(52) U.S. Cl. ................ 330/51; 330/207 P; 250/214 R; 250/214 AG; 250/214 A
(58) Field of Search ...................... 250/214 R, 214 AG, 250/214 A; 330/207 P, 284, 51, 59; 455/217, 234.1

(56) References Cited

U.S. PATENT DOCUMENTS

| | | | | |
|---|---|---|---|---|
| 4,254,481 A | * | 3/1981 | Smither et al. ............. 330/284 |
| 4,415,803 A | * | 11/1983 | Muoi ...................... 250/214 A |
| 4,498,001 A | * | 2/1985 | Smoot ........................ 455/619 |
| 4,626,954 A | * | 12/1986 | Damiano et al. ............. 361/96 |
| 5,045,809 A | * | 9/1991 | Cho ........................... 330/284 |
| 5,600,128 A | * | 2/1997 | Lindstrom ........... 250/214 AG |
| 5,606,282 A | * | 2/1997 | Yoshida ....................... 330/51 |
| 6,654,565 B2 | * | 11/2003 | Kenny ......................... 398/182 |

FOREIGN PATENT DOCUMENTS

JP 57005420 * 1/1982

OTHER PUBLICATIONS

Peterson et al. "Front–end CMOS Chipset for 10Gb/s Communication" RFIC Symposium Jun. 2–4, 2002 pp 93–96.*

* cited by examiner

Primary Examiner—Michael B. Shingleton
(74) Attorney, Agent, or Firm—Koppel, Jacobs, Patrick & Heybl

(57) ABSTRACT

Method and system for a diode shunting configuration wherein the configuration prevents a transimpedance amplifier from saturation while maintaining high transimpedance gain and bandwidth. In one embodiment of the present invention, a diode is coupled to the input of a transimpedance amplifier in order to prevent the transimpedance amplifier from saturation. Moreover, the diode serves to divert current such that in cases where the input current is low the diode never turns on and only represents a minimal, mostly capacitive load on the input; in cases where the input current is high, the diode conducts and diverts any excess input current from the transimpedance amplifier.

28 Claims, 6 Drawing Sheets

METHOD AND SYSTEM FOR TRANSIMPEDANCE AMPLIFIERS WITH HIGH CURRENT INPUT WHILE MAINTAINING HIGH TRANSIMPEDANCE GAIN AND BANDWIDTH

BACKGROUND INFORMATION

1. Field of Invention

The present invention relates to amplifiers in general, and more particularly, to a method and system for implementing transimpedance amplifiers with high current input while maintaining high transimpedance gain and bandwidth.

2. Description of Related Art

A transimpedance amplifier is used to convert an input current to a proportional output voltage. A typical transimpedance amplifier comprises: an input current that is supplied through a transistor input stage, the input current is typically produced by a photodiode; an output carrying an output voltage; and a coupling member connecting the input to the output. Furthermore, the input current may be small, such as 1 $\mu$A, or comparatively large, such as 1 mA.

Typical uses of transimpedance amplifiers include summing currents as part of a frequency impulse response filter or processing reverse current produced by a photodiode as a function of infrared signal energy received by the photodiode.

In circumstances where a transimpedance amplifier receives high input current from a photodiode, the current may drive the transimpedance amplifier into a state of deep saturation where a large input signal spoils the sensitivity of the amplifier to a following smaller signal.

In order to prevent the transimpedance amplifier from saturation, several conventional methods have been established. FIG. 1 illustrates one embodiment of a conventional method for preventing saturation wherein a transimpedance optical receiver denoted 100 comprises: an input modulated light denoted 1, a photodiode denoted 3, a transimpedance amplifier denoted 5, a load resistor denoted 7, a non-linear diode denoted 9, and an output denoted 11.

Optical receiver 100 receives modulated light 1 from an optical fiber. Subsequently, the light falls onto photodiode 3. Moreover, photodiode 3 is connected to the inverting input of amplifier 5, resistor 7 is connected across amplifier 5, and diode 9 such as a Schottky diode is connected in parallel with resistor 7.

As shown in FIG. 1, diode 9 is added to receiver 100 in order to prevent amplifier 5 from saturation. Conventionally, a Schottky diode is chosen as diode 9 due to the fact that a Schottky diode has negligent effect on the receiver at low current input. At large current inputs, a Schottky diode conducts to limit the receiver's output and prevents saturation.

However, traditional methods that prevent saturation such as shown in FIG. 1 are limited and cause an increase in determninistic jitter at the output. Furthermore, the bit error rate (BER) increases in response to the increased jitter and eventually reaches a point where the transferred data can no longer be recovered.

Accordingly, there is a need to prevent transimpedance amplifiers with high current input from saturation while maintaining high transimpedance gain and bandwidth.

SUMMARY OF THE INVENTION

The present invention provides a method and system for preventing a transimpedance amplifier from saturation while maintaining high transimpedance gain and bandwidth.

In a first embodiment of the present invention, a diode is coupled to the input of a transimpedance amplifier in order to prevent the transimpedance amplifier from saturation. Moreover, the diode serves to divert current such that in cases where the input current is low the diode is not turned on and represents only a minimal, mostly capacitive load on the input; in cases where the input current is high, the diode conducts and diverts any excess input current from the transimpedance amplifier.

In a second embodiment of the present invention, a diode is coupled to the input of a transimpedance amplifier in order to prevent the transimpedance amplifier from saturation. The diode serves to divert excess current from the transimpedance amplifier in cases where the input current is high. Additionally, a resistive divider is coupled to the diode in order to further optimize the overall performance of the transimpedance amplifier.

In a third embodiment of the present invention, a diode is coupled to the input of a transimpedance amplifier in order to prevent the transimpedance amplifier from saturation. The diode serves to divert excess current from the transimpedance amplifier in cases where the input current is high. Furthermore, in order to alleviate switching noise generated by the excess current through the diode, an extra buffer is added in the diode shunt configuration.

In a fourth embodiment of the present invention, a diode is coupled to the input of a transimpedance amplifier in order to prevent the transimpedance amplifier from saturation. The diode serves to divert excess current from the transimpedance amplifier in cases where the input current is high. Furthermore, the configuration of the embodiment is such that the input stage may be independent of the output.

The diode shunt configuration of the present invention diverts excess current from a transimpedance amplifier in order to prevent the amplifier from saturation while maintaining high gain and bandwidth.

BRIEF DESCRIPTION OF THE DRAWINGS

The accompanying drawings that are incorporated in and form a part of this specification illustrate embodiments of the invention and together with the description, serve to explain the principles of the invention.

DETAILED DESCRIPTION

The following description is presented to enable one of ordinary skill in the art to make and use the invention and is provided in the context of a patent application and its requirements. In the following description, specific nomenclature is set forth to provide a thorough understanding of the present invention. It will be apparent to one skilled in the art that the specific details may not be necessary to practice the present invention. Furthermore, various modifications to the embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 1:
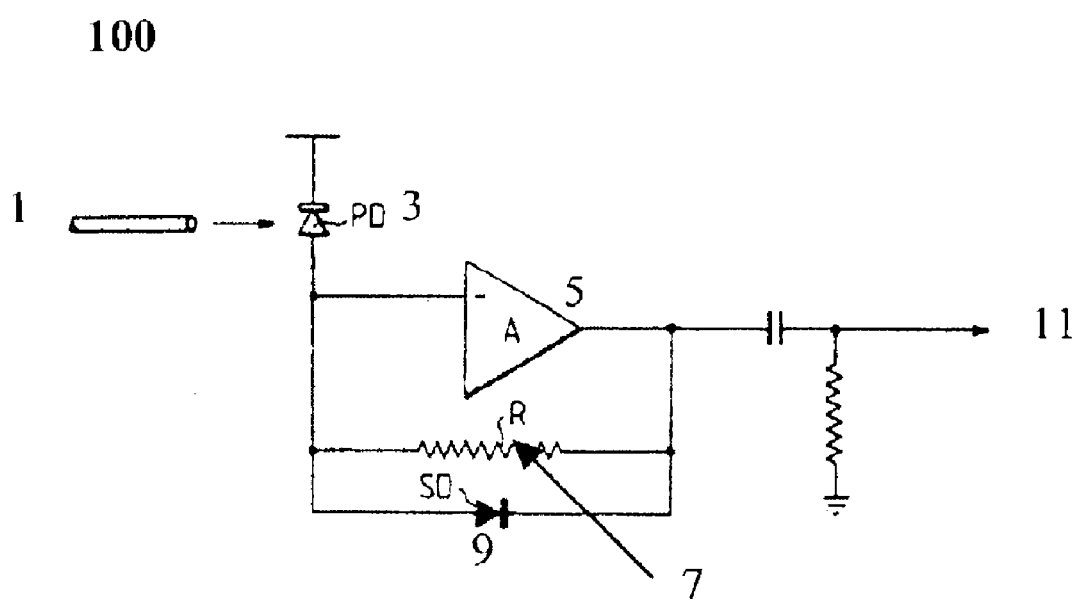
FIG. 1 is a prior art diagram illustrating a conventional solution to transimpedance amplifier saturation.
Figure 2:
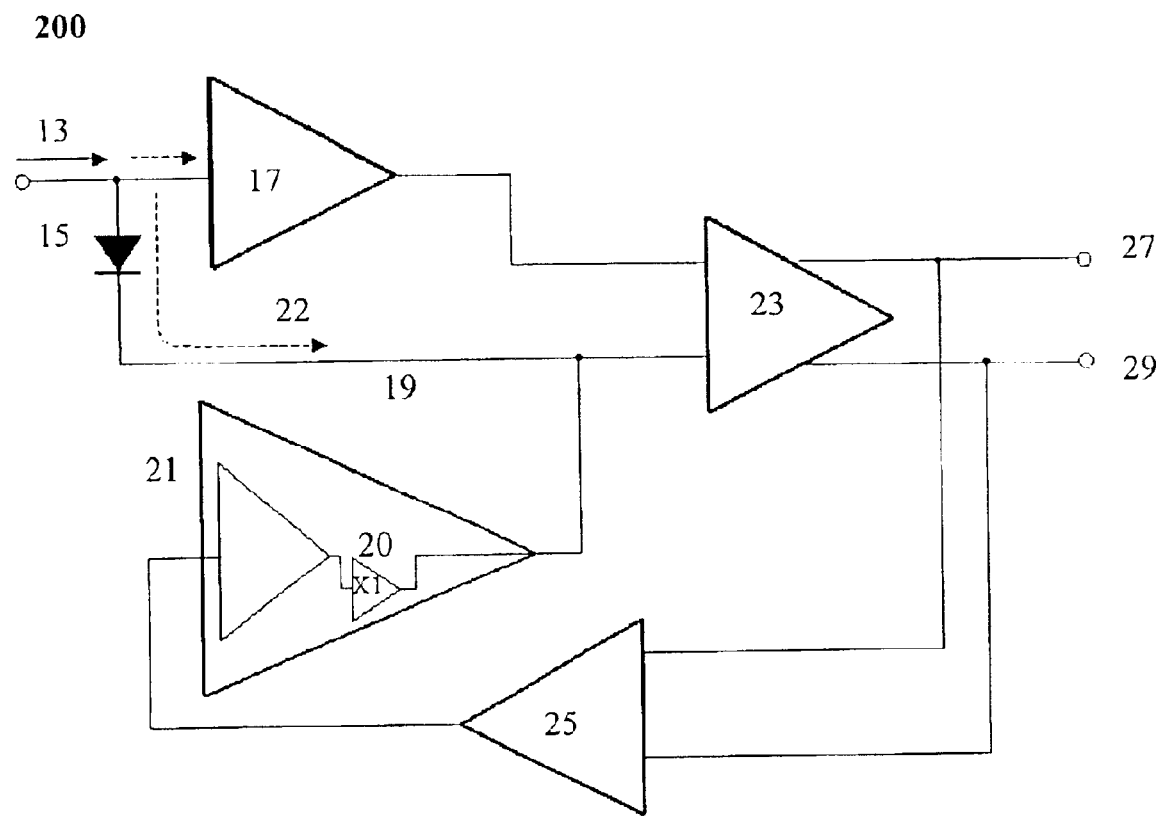
FIG. 2 is a circuit diagram illustrating a diode coupled to the input of a transimpedance amplifier in order to prevent saturation in accordance to a first embodiment of the present invention.

FIG. 2 illustrates a circuit 200 of a diode shunt configuration in accordance to one embodiment of the present invention. Circuit 200 generally comprises: an input current signal denoted 13, a circuit denoted 15 generally comprising a diode, an amplifier denoted 17 generally comprising a transimpedance amplifier (TIA), a reference point denoted 19, an amplifier denoted 21 generally comprising a TIA, a circuit denoted 20 generally comprising a buffer, an amplifier denoted 23 generally comprising a limiting amplifier, an amplifier denoted 25 generally comprising a direct current (DC) amplifier, a first output denoted 27, and a second output denoted 29.

Typically, a photodiode produces the input signal 13 that is directed to circuit 15. Circuit 15 is coupled to a first input of amplifier 17, and a first output of amplifier 17 is coupled to a first input of amplifier 23. Amplifier 23 produces outputs 27 and 29 coupled to a first and a second input of amplifier 25 respectively. Amplifier 25 in turn produces an output coupled to an input to amplifier 21, and amplifier 21 produces an output coupled to a second input of amplifier 23.

As shown in FIG. 2, circuit 15 functions to shunt excessive current from amplifier 17. In cases where input current 13 is low (i.e. below a preset threshold value), circuit 15 does not turn on and represents only a minimal, mostly capacitive load on the input. However, in cases where input current 13 is high (i.e. above a preset threshold value), the voltage at reference point 19 falls in response to the high current and circuit 15 conducts and diverts the excess input current towards reference point 19 as indicated by the dashed arrow denoted 22, effectively preventing amplifier 17 from saturation.

Furthermore, because a fixed DC voltage at reference point 19 can optimally accommodate only a particular input current level, a control voltage at reference point 19 is adjusted adaptively in order to optimize the overall transimpedance amplifier performance. The connection of DC voltage at reference point 19 as shown in FIG. 2 decreases with increasing average input current which results in improved diode shunting at high currents while improving the diode cut-off state at low currents where shunting is not necessary.

Figure 3:
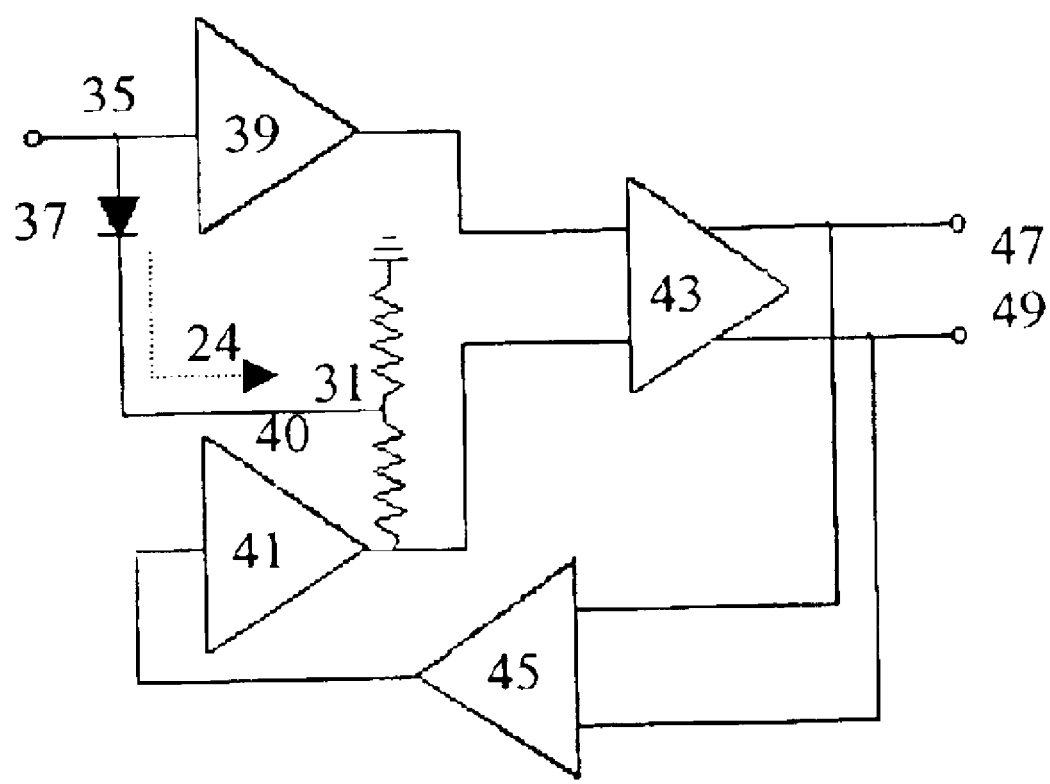
FIG. 3 is a circuit diagram illustrating a second embodiment of the present invention that employs an additional resistive divider.

FIG. 3 illustrates a circuit 300 of a diode shunt configuration in accordance to a second embodiment of the present invention. Circuit 300 generally comprises: an input current signal denoted 35, a circuit denoted 37 generally comprising a diode, an amplifier denoted 39 generally comprising a TIA, a reference point denoted 40, an amplifier denoted 41 generally comprising a TIA, an amplifier denoted 43 generally comprising a limiting amplifier, an amplifier denoted 45 generally comprising a DC amplifier, a first output denoted 47, a second output denoted 49, and a circuit denoted 31 generally comprising a resistive divider.

Typically, a photodiode produces the input signal 35 that is directed to circuit 37. Circuit 37 is coupled to a first input of amplifier 39, and a first output of amplifier 39 is coupled to a first input of amplifier 43. Amplifier 43 produces outputs 47 and 49 coupled to a first and a second input of amplifier 45 respectively. Amplifier 45 in turn produces an output coupled to an input to amplifier 41. Amplifier 41 produces an output coupled to a second input of amplifier 43.

As shown in FIG. 3, circuit 37 shunts excessive current from amplifier 39. In cases where input current 35 is low (i.e. below a preset threshold value), circuit 37 does not turn on and only represents a minimal, mostly capacitive load on the input. However, in cases where input current 35 is high (i.e. above a preset threshold value), the voltage at the output of circuit 41 and at reference point 40 falls in response to the high current and circuit 37 conducts and diverts the excess input current towards reference point 40 as indicated by the dashed arrow denoted 24, effectively preventing amplifier 39 from saturation.

Furthermore, because a fixed DC voltage at reference point 40 can optimally accommodate only a particular input current level, a control voltage at reference point 40 is adjusted adaptively in order to optimize the overall transimpedance amplifier performance. The connection of DC voltage at reference point 40 as shown in FIG. 3 decreases with increasing average input current which results in improved diode shunting at high currents while improving the diode cut-off state at low currents where shunting is not necessary.

Circuit 31 is added to the embodiment shown in FIG. 3 in order to further optimize the adaptability of the control voltage at reference point 40.

Figure 4:
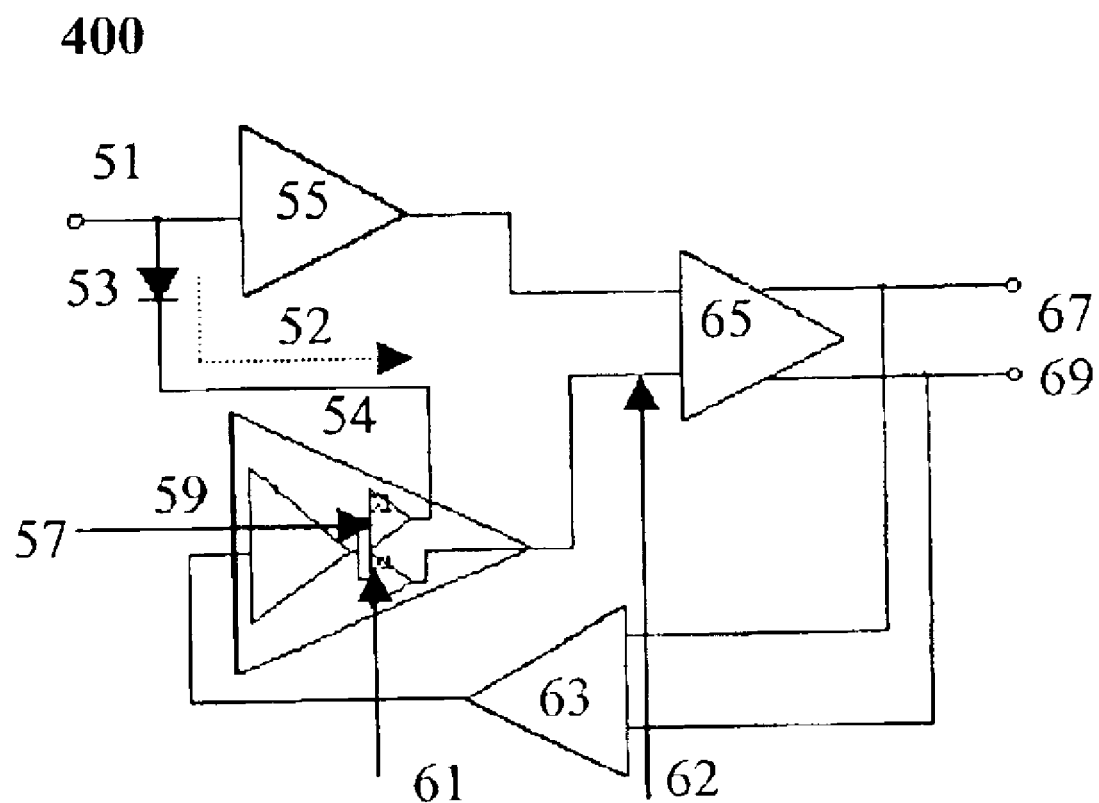
FIG. 4 is a circuit diagram illustrating a third embodiment of the present invention that employs an additional buffer.

FIG. 4 illustrates a circuit 400 of a diode shunt configuration in accordance to a third embodiment of the present invention. Circuit 400 generally comprises: an input current signal denoted 51, a circuit denoted 53 generally comprising a diode, an amplifier denoted 55 generally comprising a TIA, a reference point denoted 54, an amplifier denoted 59 generally comprising a TIA, a circuit denoted 57 generally comprising a buffer, a circuit denoted 61 generally comprising a buffer, an amplifier denoted 65 generally comprising a limiting amplifier, an amplifier denoted 63 generally comprising a DC amplifier, a first output denoted 67, a second output denoted 69, and a reference voltage input denoted 62.

Typically, a photodiode produces the input signal 51 that is directed to circuit 53. Circuit 53 is coupled to a first input of amplifier 55, and a first output of amplifier 55 is coupled to a first input of amplifier 65. Amplifier 65 produces outputs 67 and 69 coupled to a first and a second input of amplifier 63 respectively. Amplifier 63 produces an output coupled to an input of amplifier 59 having buffers 57 and 61. Amplifier 59 produces an output coupled to a second input of amplifier 65.

As shown in FIG. 4, circuit 53 shunts excessive current from amplifier 55. In cases where input current 51 is low (i.e. below a preset threshold value), circuit 53 does not turn on and only represents a minimal, mostly capacitive load on the input. However, in cases where input current 51 is high (i.e. above a preset threshold value), the voltage at reference point 54 falls in response to the high current and circuit 53 conducts and diverts the excess input current towards reference point 54 as indicated by the dashed arrow denoted 52, effectively preventing amplifier 55 from saturation.

Furthermore, because a fixed DC voltage at reference point 54 can optimally accommodate only a particular input current level, a control voltage at reference point 54 is adjusted adaptively in order to optimize the overall transimpedance amplifier performance. The connection of DC voltage at reference point 54 as shown in FIG. 4 decreases with increasing average input current which results in improved diode shunting at high currents while improving the diode cut-off state at low currents where shunting is not necessary.

Moreover, the diode shunt configuration illustrated in FIG. 2 and FIG. 3 may generate undesirable switching noise at reference voltage input 62. The additional buffer at amplifier 59 shown in FIG. 4 is implemented in order to alleviate said switching noise.

Figure 5:
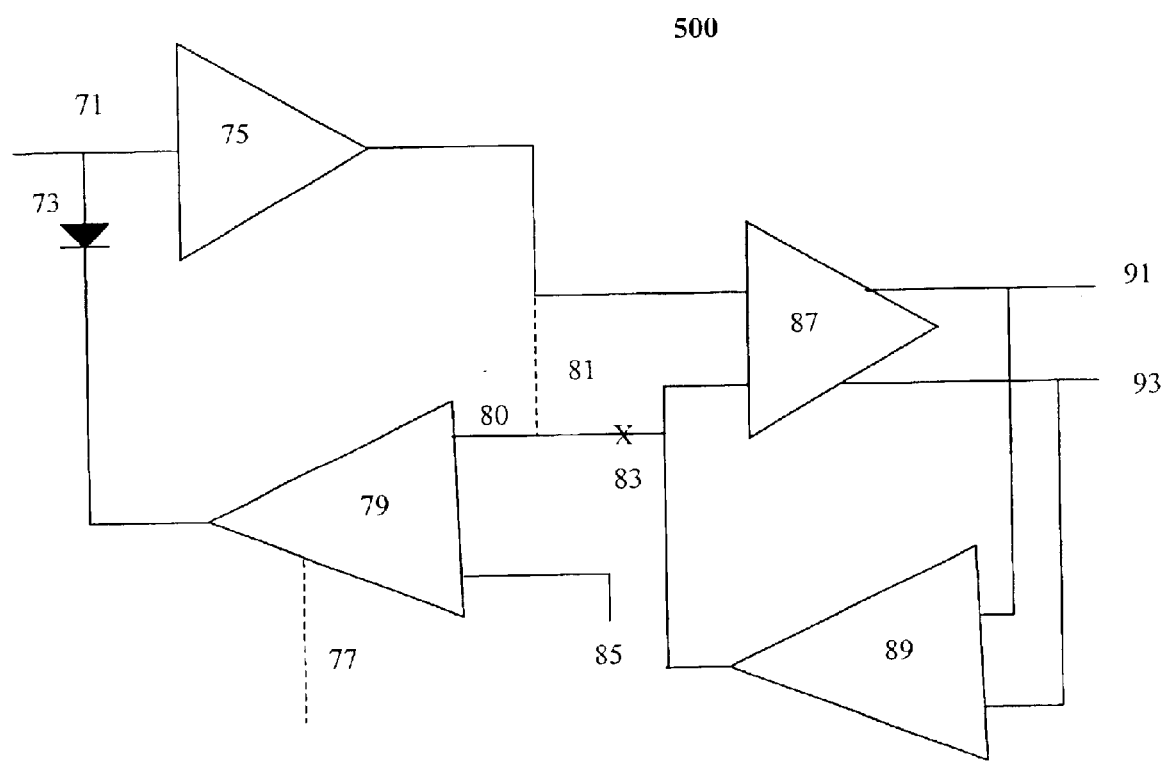
FIG. 5 is a circuit diagram illustrating a fourth embodiment of the present invention where the input stage is independent of the output of the circuit.

FIG. 5 illustrates a circuit 500 of a diode shunt configuration in accordance to a fourth embodiment of the present invention. Circuit 500 generally comprises: an input current signal denoted 71, a circuit denoted 73 generally comprising a diode, an amplifier denoted 75 generally comprising a TIA, an amplifier denoted 79 generally comprising a DC amplifier, an amplifier denoted 87 generally comprising a limiting amplifier, an amplifier denoted 89 generally comprising a DC amplifier, a reference signal denoted 85, an external filter capacitor denoted 77, a first output denoted 91, and a second output denoted 93.

Typically, a photodiode produces the input signal 71 that is directed to circuit 73. Circuit 73 is coupled to a first input of amplifier 75, and a first output of amplifier 75 is coupled to a first input of amplifier 87. Amplifier 87 produces outputs 91 and 93 coupled to a first and a second input of amplifier 89 respectively. Amplifier 89 in turn produces an output coupled to a second input of amplifier 87.

Moreover, the cross denoted 83 illustrates a possible disconnection between the input to amplifier 79 denoted 80 and the output of amplifier 89. In cases where input 80 is coupled to the output of amplifier 89, amplifier 79 receives the output of amplifier 89 as an input; in cases where input 80 is disconnected from the output of amplifier 89, amplifier 79 receives the output of amplifier 75 as an input, as indicated by the dashed line denoted 81. The disconnection allows the input stage comprising circuit 73, amplifier 75, and amplifier 79 to be independent of the output of circuit 500 (i.e. output 91 and output 93) where the output of circuit 500 is to be configured without affecting the input stage.

As shown in FIG. 5, circuit 73 shunts excessive current from amplifier 75. In cases where input current 71 is low (i.e. below a preset threshold value), circuit 73 does not turn on and only represents a minimal, mostly capacitive load on the input. However, in cases where input current 71 is high (i.e. above a preset threshold value), the voltage at the output of amplifier 79 falls in response to the high current and circuit 73 conducts and diverts the excess input current, effectively preventing amplifier 75 from saturation.

Reference signal 85 is a threshold that may be set to any value according to desired criteria of a design, signal 85 is set to control the threshold at which the diode is turned on or off in order to divert excessive current from amplifier 75. Moreover, signal 85 may be generated externally by a device (not shown) such as a microprocessor or by other appropriate devices according to the design of a particular implementation.

Furthermore, external filter capacitor 77 may be implemented to further filter and integrate the signal output of amplifier 79.

Figure 6:
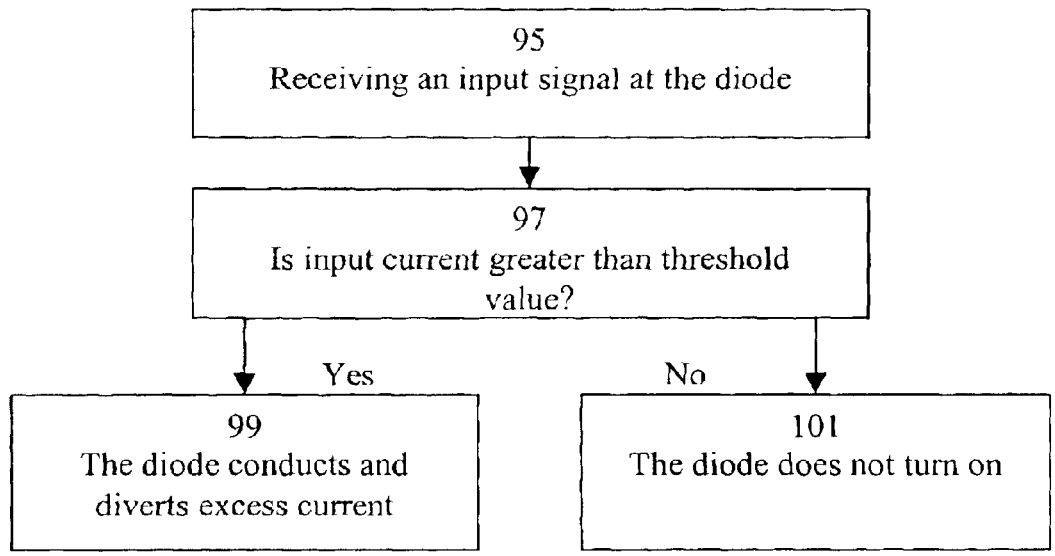
FIG. 6 is a flow diagram illustrating one embodiment of the present invention.

FIG. 6 is a flow diagram illustrating the steps for one embodiment of the present invention. In step 95, the diode receives an input signal and subsequently detects whether or not the current level of the input signal is higher than a predetermined threshold value in step 97.

If the current of the input signal is greater than the threshold value, the diode conducts and diverts the excess current in step 99, otherwise, the diode does not turn on and represents only a minimal, mostly capacitive load on the input in step 101.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the arts to best utilize the invention and various embodiments with various modifications as are suited to the particular use contemplated. It is intended that the scope of the invention be defined by the Claims appended hereto and their equivalents.

We claim:

1. A current shunting configuration, comprising:

an input signal;

a shunt circuit for receiving said input signal;

a first amplifier having a first input coupled to a first end of said shunt circuit, wherein said shunt circuit adaptively shunts excessive input current from saturating said amplifier; and a second amplifier having a first input coupled to a first output of said first amplifier;

said second amplifier comprising a first output and a second output;

a third amplifier having a first and a second input coupled to said first and second outputs of said second amplifier, respectively, and a first output;

a fourth amplifier having a first input coupled to said first output of said third amplifier, and a first output;

wherein said first output of said fourth amplifier is coupled to a second input of said second amplifier.

2. A current shunting configuration, comprising:

an input signal;

a shunt circuit for receiving said input signal;

a first amplifier having a first input coupled to a first end of said shunt circuit, wherein said shunt circuit adaptively shunts excessive current from saturating said amplifier;

a second amplifier having a first input coupled to a first output of said first amplifier; and a resistive divider coupled to a second end of said shunt circuit;

said second amplifier comprising a first output and a second output.

3. The configuration of claim 2, further comprising a third amplifier having a first and a second input coupled to said first and second outputs of said second amplifier respectively.

4. The configuration of claim 3, wherein said third amplifier further comprising a first output.

5. The configuration of claim 4, further comprising a fourth amplifier coupled to said first output of said third amplifier.

6. The configuration of claim 5, wherein said fourth amplifier comprises a first output.

7. The configuration of claim 6, wherein said resistive divider is coupled to the first output of said fourth amplifier.

8. The configuration of claim 7, wherein said first output of said fourth amplifier is coupled to a second input of said second amplifier.

9. A current shunting configuration, comprising:

an input signal;

a shunt circuit DC-coupled to said input signal;

a first amplifier having a first input coupled to a first end of said shunt circuit, wherein said shunt circuit adaptively shunts excessive DC input current from saturating said amplifier; and a second amplifier having a first output connected to a second end of said shunt circuit.

10. The configuration of claim 9, wherein said first amplifier is a transimpedance amplifier.

11. The configuration of claim 9, wherein said shunt circuit is a diode.

12. The configuration of claim 9, wherein said second amplifier is a DC amplifier.

13. The configuration of claim 9, further comprising a third amplifier having a first input coupled to a first output of said first amplifier.

14. A current shunting configuration, comprising:

an input signal;

a shunt circuit DC-coupled to said input signal;

a first amplifier having a first input coupled to a first end of said shunt circuit, wherein said shunt circuit adaptively shunts excessive input current from saturating said amplifier; and a second amplifier having a first output coupled to a second end of said shunt circuit; and a third amplifier having a first input coupled to a first output of said first amplifier;

said third amplifier comprising a first and a second output.

15. The configuration of claim 14, further comprising a fourth amplifier having a first input and a second input coupled to said first and second outputs of said third amplifier respectively.

16. The configuration of claim 15, wherein a second input of said third amplifier and a first input of said second amplifier are commonly coupled to a first output of said fourth amplifier.

17. The configuration of claim 16, wherein said second amplifier further comprises a second input coupled to a reference signal.

18. The configuration of claim 15, wherein a second input of said third amplifier is coupled to a first output of said fourth amplifier.

19. The configuration of claim 18, wherein a first input of said second amplifier is coupled to said first output of said first amplifier.

20. The configuration of claim 19, wherein said second amplifier further comprises a second input coupled to a reference signal.

21. A diode shunting configuration, comprising:

an input signal;

a circuitry for receiving said input signal;

a first amplifier having a first input coupled to a first end of said circuitry, wherein said circuitry adaptively shunts excessive current from saturating said amplifier;

a second amplifier coupled to a first output of said first amplifier;

a third amplifier coupled to a first and a second output of said second amplifier; and a fourth amplifier comprising a buffer, coupled to a first output of said third amplifier, and having a first output coupled to a second input of said second amplifier.

22. The configuration of claim 21, wherein said first amplifier is a transimpedance amplifier.

23. The configuration of claim 22, wherein said circuitry is a diode.

24. The configuration of claim 23, wherein said second amplifier is a limiting amplifier.

25. The configuration of claim 24, wherein said third amplifier is a DC amplifier.

26. The configuration of claim 25, wherein said fourth amplifier is a transimpedance amplifier.

27. A current shunting configuration, comprising:

an input signal;

a shunt circuit DC-coupled to said input signal;

a first amplifier having a first input coupled to a first end of said shunt circuit;

a second amplifier having a first output coupled to a second end of said shunt circuit;

a third amplifier having a first input coupled to a first output of said first amplifier and having first and second outputs; and a fourth amplifier having a first input and a second input coupled to said first and second outputs of said third amplifier, respectively, said fourth amplifier having an output which is coupled to a second input of said third amplifier and to a first input of said second amplifier;

wherein said shunt circuit adaptively shunts excessive DC input current from saturating said amplifier.

28. A current shunting configuration, comprising:

an input signal;

a shunt circuit DC-coupled to said input signal;

a first amplifier having a first input coupled to a first end of said shunt circuit;

a second amplifier having a first output coupled to a second end of said shunt circuit;

a third amplifier having a first input coupled to a first output of said first amplifier and having first and second outputs; and a fourth amplifier having a first input and a second input coupled to said first and second-outputs of said third amplifier, respectively, said fourth amplifier having an output which is coupled to a second input of said third amplifier;

a first input of said second amplifier coupled to said first output of said first amplifier;

wherein said shunt circuit adaptively shunts excessive DC input current from saturating said amplifier.

* * * * *